United States Patent [19]

Fast et al.

[11] Patent Number: 4,646,031

[45] Date of Patent: Feb. 24, 1987

[54] NARROWBAND PHASE-LOCK LOOP CIRCUIT WITH AUTOMATIC CONVERGENCE

[76] Inventors: Raymond D. Fast, 206-932 Robinson St., Coquitlam, B.C., Canada, V3J 7R8; Brian A. Murray, 1502-9304 Salish Ct., Burnaby, B.C., Canada, V3J 7C5

[21] Appl. No.: 698,992

[22] Filed: Feb. 7, 1985

[51] Int. Cl.[4] ............................................. H03L 7/08
[52] U.S. Cl. ....................................... 331/25; 331/1 R
[58] Field of Search .................... 331/1 A, 1 R, 4, 17, 331/25

[56] References Cited

U.S. PATENT DOCUMENTS 4,007,429  2/1977  Cadalora et al. ................... 331/17
4,119,927 10/1978  Metteer et al. ...................... 331/4
4,486,717 12/1984  Yamasaki .............................. 331/4

Primary Examiner—Gene Wan

[57] ABSTRACT

The phase detector of a phase-lock loop comprises a double balanced mixer that compares the phase of the output signal of the loop oscillator with that of a reference signal and combines the resultant error control voltage with a constant sweep voltage that is stepped at a variable rate. When the loop is out of lock, a counter circuit increments the contents thereof for every n excursions of the difference frequency signal from the phase detector that exceed a prescribed threshold level. A D-A converter converts each unique count to a corresponding constant amplitude step of the stepped sweep voltage. Since the difference between the frequencies of the oscillator and reference signals decreases as the loop approaches lock, the rates at which the counter is incremented and the sweep voltage changes value also decrease. Thus, the loop is swept at a slower rate as the frequencies of the reference and oscillator signals converge. When the loop is locked, the sweep voltage from the converter is maintained at a constant value so that the output signal of the phase detector is the conventional loop error control voltage superimposed on the constant value of sweep voltage.

11 Claims, 1 Drawing Figure

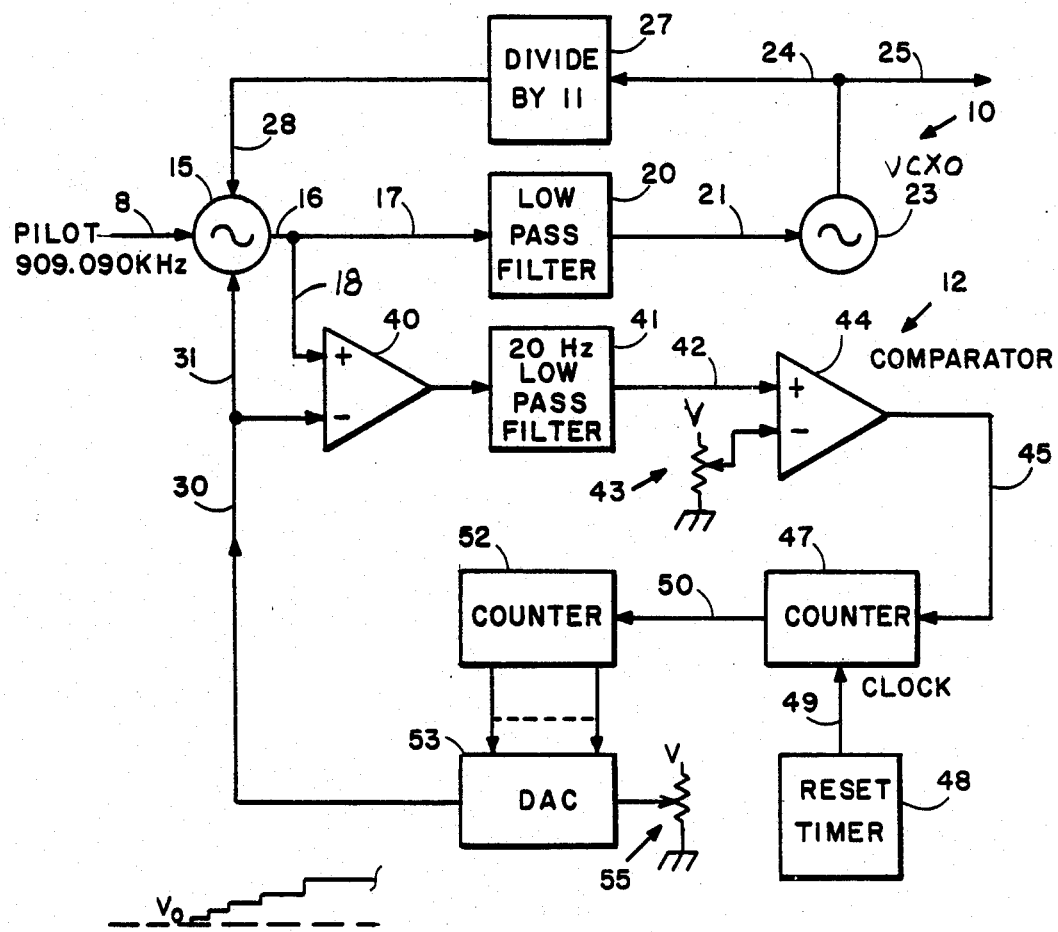

NARROWBAND PHASE-LOCK LOOP CIRCUIT WITH AUTOMATIC CONVERGENCE

RELATED APPLICATION

This relates to US patent application Ser. No. 698,991, filed 02/07/85.

BACKGROUND OF THE INVENTION

This invention relates to phase-lock loops and more particularly to a very narrowband phase-lock loop circuit in which a voltage controlled oscillator (VCO) is swept at a variable rate to bring its operating frequency into the correspondingly narrow capture range of the loop.

A phase-lock loop generally comprises an oscillator such as a voltage controlled oscillator, a phase detector, and a low pass filter. Manual adjustment of the oscillator frequency is feasible only on very stable oscillators with low aging rates. If the long term stability of the oscillator is such that aging of the frequency determining element (i.e., a crystal) thereof places its operating frequency outside the loop's capture range within a specified period of time, then manual adjustment is not acceptable. Although complex oscillator circuits are available that are very stable over long time intervals such as one year, they are very expensive. A sweep circuit is therefore most often used to compensate for such aging. The sweep circuit varies the oscillator frequency over a broad range when the loop loses lock and causes it to reacquire lock. Problems encountered when using a sweep circuit with a narrowband phase-lock loop are that a long time interval may be needed to reacquire lock since slow sweep rates are required, and that a momentary loss of an input or reference signal to the phase detector most often pulls the loop out of lock. These are problems which must be addressed in satellite telephone communication systems where it is necessary to lock a master oscillator to a pilot tone. In such equipment it is particularly desirable to employ a very narrowband phase-lock loop for maximum rejection of noise in the input-reference pilot signal where the output of the loop is used as a reference in satellite earth station equipment and multiplied up to a much higher frequency for transmission. In such satellite applications a natural phenomena occurs approximately twice a year that causes a conventional phase-lock loop in satellite earth station equipment to lose lock. This condition may occur because of alignment of the satellite with the sun such that the satellite receiving antenna looks directly into and receives microwave radiation from the sun. When it is possible to re-establish communication, it is desirable that the loop rapidly-automatically regain lock.

A conventional analog sweep circuit produces a ramp votlage that is combined with a correction voltage from the phase detector, with the resultant signal being applied to a control input of the master oscillator. The ramp voltage continuously varies the carrier frequency until it is aligned with the pilot frequency of the input signal. At this point the correction voltage from the phase detector overrides the sweep voltage and the loop becomes locked. Even a momentary loss of the pilot-reference signal, however, causes the phase detector's output voltage to go to zero. The ramp voltage is then predominent once again and can easily drive the carrier frequency outside the loop's lock range. When this happens the conventional loop will not reacquire lock until a full cycle of the ramp voltage has occurred. A digital sweep circuit generally comprises signal detectors and logic circuitry to determine whether loss of lock is due to the loop losing its reference or to aging of the oscillator. Such a sweep circuit sweeps by increments when the reference is present and the loop is out of lock and can remember the last value of the sweep voltage if the reference is lost only briefly. Both of these techniques have the common drawback of requiring very slow sweep rates when they are used in narrowband phase-lock loops. This is due to bandwidth limitations imposed by the loop filter. It is known that the sweep rate for phase detectors having sinusoidal outputs cannot exceed the square of the loop's natural frequency. If the sweep rate is faster than this limit, the control voltage passed through the loop filter lags behind the sweep voltage at the oscillator sufficiently that when the control voltage at the oscillator places the oscillator frequency within the loop's capture range, the control voltage from of the phase detector has actually increased sufficiently to subsequently move the oscillator frequency outside the capture range, i.e., there is a delay. Thus, when loop transients have settled out, the control voltage at the oscillator will equal the sweep voltage at the output of the phase detector and the loop wil be pulled through the lock range. Very slow sweep rates, and thus very long acquisition times, are therefore normally required for narrowband phase-lock loops.

An object of this invention is the provision of an improved narrowband phase-lock loop circuit.

SUMMARY OF THE INVENTION

In accordance with this invention, phase-lock loop apparatus comprises: voltage controlled oscillator means providing an output signal having a frequency that is controlled by an external voltage that is applied to an input terminal thereof; phase detector means that is responsive to the output signal of said oscillator means and an input reference signal for producing an output signal that is related to one of the difference in frequency and phase of the two signals that are applied thereto; low-pass filter means passing low frequency signal components in the output signal of said phase detector means to said input terminal to said oscillator means; and sweep means for biásing said oscillator means for varying said frequency of said output signal of said oscillator means at a variable sweep rate over a band of frequencies including the frequency of said input reference signal. The sweep rate may be stepped and decreases as the frequencies of the output signal of the oscillator means and the reference signal converge.

BRIEF DESCRIPTION OF THE DRAWING

FIG. 1 shows a block diagram of the phase-lock loop circuit according to the present invention.

DESCRIPTION OF PREFERRED EMBODIMENTS

Referring now to the single figure of drawing which is a block diagram of a preferred embodiment of this invention, the illustrated apparatus comprises a phase-lock loop 10 in combination with a sweep circuit 12 which has a variable sweep rate. The loop 10 comprises a phase detector circuit 15, a very narrowband loop filter 20 which primarily establishes the loop bandwidth and capture range, a voltage controlled crystal oscillator (VCXO) 23, and a divider circuit 27. In a narrowband loop that was developed for space telephone applications, the pilot or reference frequency fi of an input or reference signal on line 8 was 909.090 kHz, and circuit 27 was a divide-by-eleven circuit for providing a signal on line 28 of substantially the same frequency fi as the input signal. The overall closed loop transfer function had a cutoff frequency of approximately 0.5 Hz for establishing very tight control of the noise rejection characteristics of the loop.

The phase detector circuit 15 of the phase-lock loop 10 is operative for combining the input and divided-down oscillator signals on lines 8 and 28, respectively, for producing a loop control voltage on line 16 which is a function of the difference frequency fi–f0. The detector circuit 15 here is also responsive to an output signal voltage from the sweep circuit 12 on line 31 for combining it with the conventional loop control voltage for driving the oscillator 23. The detector circuit 15 may, by way of example, comprise a double balanced mixer such as a Model SBL-1 double balanced mixer of Mini-Circuits of Brooklyn, New York. One side of this mixer that is normally grounded receives the feedback signal on line 31 from the sweep circuit 12. The other side of this mixer provides the output signal 16 thereof which is the sum of the feedback signal and the conventional loop control voltage. Alternatively, the detector circuit 15 here may comprise a conventional dual input mixer having the output thereof and the feedback voltage on line 31 applied to a summing circuit such as a linear adder. When the loop is out of lock, the output voltage 16 of the phase detector is an alternating beat frequency signal having a peak amplitude of a fixed value and a beat frequency that is the difference between the divided-down oscillator frequency and the pilot frequency fi. In contrast, the output voltage 16 of the phase detector is essentially a low level DC voltage that is proportional to the phase difference between the divided-down oscillator frequency and the reference frequency fi when the loop is locked.

The low pass loop filter 20 has a cutoff frequency selected so that the loop has a natural frequency of approximately 0.5 Hz and sufficient loop gain to establish very tight control of the operating frequency of the oscillator, e.g., within ½ Hz of the reference frequency fi of the input signal 8 which may have considerable noise on it. In this way the noise is blocked from the output of the loop. The difference frequency of the beat signal that is produced by the phase detector 15 when the loop is not locked is above the cutoff frequency of the loop filter 20 so that it is blocked from the oscillator. As is described more fully hereinafter, the sweep or feedback voltage on lines 30–32 is an analog voltage that is comprised of a plurality of steps of a fixed height which occur at the variable rate that is related to the beat frequency. This provides a stepped DC offset in the control voltage on line 16. The filter 20 may comprise an RC integrating structure for converting the steps to ramp voltages on line 21 which smoothly drive the oscillator at a variable rate for causing the loop to rapidly acquire or reacquire lock.

The sweep circuit 12 essentially comprises a differential amplifier 40, a low pass filter 41, a comparator 44, a first counter 47 which is periodically reset by a timer circuit 48, a second counter 52, and a digital to analog converter 53. The digital to analog converter converts the contents of the counter 52 to constant amplitude voltage steps that occur at a variable rate which is related to the beat frequency in the output of the phase detector when the loop is not locked. The size of the steps may be established by the potentiometer 55. The step size is set to provide a frequency change in the output 24 of the oscillator that is approximately one-half the loop's capture range, which capture range is about 0.5 Hz. The sense or direction of the steps is selected to be the same as the change in oscillator frequency that is caused by aging of the crystal. When the loop is locked, the output of the converter is a fixed amplitude.

The amplifier 40 is operative for extracting the beat frequency signal from the DC offset that is provided by the feedback or sweep signal 31 in the output 16 of the phase detector. The low pass filter 41 has a cutoff frequency of approximately 20 Hz for passing the beat frequency signal and blocking much extraneous noise which may be introduced on the input signal 8. A potentiometer 43 establishes a threshold voltage on the inverting input of the comparator 44 so that it passes only excursions on cycles of the beat signal that exceed this threshold level and which occur only when the loop is not locked. The comparator does not produce output pulses for variations in the output of the phase detector which occur when the loop is locked.

The counter 47 sums the pulses in the output of the comparator and produces an output pulses on line 50 for every n pulses that are produced by the comparator. By way of example, n may be 3 or any other integer number that is consistent with the application of the loop. Thus, counter 47 may produce one output pulse for every 3 input pulses. Since noise signals will cause pulses to be randomly produced in the output of the comparator 44, it is desirable to periodically reset the counter 47 so that a plurality of noise pulses that occur over a long time interval will not inadvertently overflow counter 47 and trigger the second counter 52, which will then drive the loop out of lock. In accordance with one aspect of this invention, the circuit 48 periodically produces an output pulse which resets the counter 47 at a rate which is much less than the period of the lowest beat frequency that is generated prior to the oscillator 23 being driven into the lock range of the loop, which lock range is approximately 0.5 Hz. By way of example, the circuit 48 may reset the counter 47 every two minutes. Since it may take up to 10 minutes or more to reacquire lock of the loop, this means that the counter 47 will be reset at times when it actually holds a count corresponding to beat frequency pulses rather than noise. This in not important, however, since it merely means that the loop will stay out of lock for a few seconds longer than it would if the circuit 48 were not present.

The counter 52 is a conventional serial input and parallel output counter which is automatically reset to a zero count after a prescribed count is reached. By way of example, counter 52 may be a 7 bit counter which is automatically reset after a count of 128. This means that only a portion of the counter 52 is used in this application. Each time the output pulse of the divide by 3 counter 47 goes negative, for example, the count in counter 52 is incremented by 1. Thus, as the beat frequency on lines 18 and 42 and in the output of the comparator 44 decreases, then the rate at which the counter 52 is incremented is also decreased. The circuit 53 converts the contents of the counter 52 to associated analog voltage steps that are of a constant magnitude for each count thereof. Thus, there are 128 voltage steps in this example, with the magnitudes of the steps being constant and set by the potentiometer 55. Both of the counters 47 and 52 are reset to zero count when the system is initially turned on. This sets the converter output voltage to a minimum value, for example, which causes the oscillator to operate at a minimum frequency.

When power is initially applied to the circuit in the drawing, the counter 47 and 52 are set to zero so that the converter 53 produces its minimum output or sweep voltage. This sweep voltage is applied to one end of the phase detector 15, i.e., the double balanced mixer, and serves as a reference voltage there. Since the loop is initially out of lock, the phase detector generates a beat frequency signal, having a fixed peak amplitude and a frequency that is proportional to the difference between the pilot and divided-down carrier oscillator frequencies, superimposed on the sweep voltage. The combined signals in the output of the phase detector cause the oscillator 23 to operate at its minimum frequency which is below that of the reference frequency fi of the input signal. The relatively high frequency beat frequency signal is blocked from the oscillator by the loop filter 20. This beat frequency signal is extracted from the DC offset on line 32 by the differential amplifier 40, however, which is connected across the phase detector and is passed by the low pass filter 41. All excursions of this filtered beat frequency signal on line 42 that are above the threshold level of the comparator 44 will increment the counter 47. In this manner every third cycle of the beat frequency overflows the counter 47 for incrementing the counter 52 so as to increase the sweep voltage on lines 30–32 by a single step-increment. This change in the sweep voltage on line 31 increases the DC level in the output of the phase detector 15 and thus increases the VCXO oscillator frequency and causes a corresponding decrease in the frequency of the beat signal. This means that a longer period of time is required for the next three above threshold excursions of the beat frequency signal on line 42, and thus a longer period of time to overflow the counter 47 and increment the counter 52. Thus, as the frequencies of the divided-down oscillator frequency signal 28 and the reference signal 8 converge, the time intervals between incrementations of the counter 52 are successively longer until the sweep rate becomes less than the square of the natural frequency of the loop. Since the change in oscillator frequency per step of sweep voltage is set at approximately ½ the loop's capture range (i.e., approximately 0.25 Hz in this application), this causes a particular step in the incremented sweep voltage to place the oscillator frequency solidly within the lock range of the loop. When the loop is finally locked, there is no beat frequency signal having peak excursions which exceed the threshold level of the comparator. This implies that the counters are no longer incremented and the output of the converter 53 remains at a fixed or constant voltage.

Consideration of the operation of the circuit in the drawing reveals that a loss of the reference signal on line 8 will result in a loss of the beat frequency or loop error signal on output line 16 of the phase detector. This occurrence will have no affect on the operation of the sweep circuit or loop here since the output voltage of the converter 53 will remain at the same constant value that it had when the input signal was present on line 8. Thus, the sweep circuit 12 has a inherent memory of the requisite value of sweep voltage that is required for maintaining lock of the loop. This means that the DC level of the control voltage that is applied to the oscillator will remain fixed so that the oscillator frequency will stay within the lock range of the loop. When the input signal 8 is restored, the loop will immediately reacquire lock without sweeping of the loop, unless the reference frequency of the input signal 8 has drifted dramatically. This feature of the circuit is particularly useful when the communication link is broken.

The sense of the change in the output voltage of the converter, i.e., either increasing or decreasing as the count in counter 52 increases is selected to be opposite to the direction of aging of the frequency determining element or crystal of the oscillator 23. If the crystal of the oscillator 23 ages sufficiently that the loop can no longer hold lock, a beat frequency is generated which causes incrementation of the counter and a corresponding change in the converter's output voltage. Assuming that the oscillator's frequency decreases with age, as the loop comes out of lock as a result of aging of the crystal then incrementation of the counter makes the converter's output voltage increase. This causes a corresponding increase in the DC level of the control voltage 16 that is applied to the oscillator for increasing its frequency. This means that only one or two incrementations of the counter 52 and steps of the sweep voltage 31 are required for the loop to reacquire lock. If the sense of the sweep voltage is selected to move in the same direction as aging of the crystal, an entire cycle of operation of the counter 52 and stepping of the sweep voltage (i.e., until the counter 52 rolls over and restarts from zero) is required to reacquire lock of the loop.

Although this invention is described in relation to preferred embodiments thereof, variations and modifications thereof are possible. By way of example, the sweep voltage may be applied to the input of the loop filter 20 or the oscillator 23 through a linear adder. The scope of this invention will therefore be determined from the appended claims rather than from the aforementioned detailed descriptions of preferred embodiments thereof.

What is claimed is:

1. Phase-lock loop apparatus comprising:
   a voltage controlled oscillator (VCO) having input and output terminals and providing an output signal whose frequency is controlled by an external voltage applied to said input terminal;
   phase detector means being responsive to said VCO output signal and to an input reference signal for producing an output signal;
   low-pass filter means coupling to said input terminal of said VCO low frequency signal components in the output signal of said phase detector means;
   sweep means providing a sweep signal to said phase detector means for biasing said VCO to vary said VCO output frequency at a variable rate over a band of frequencies including the frequency of said input reference signal;
   said phase detector means producing output signal corresponding to the phase difference between said pair of input signals thereto when the loop comprising said VCO, said detector means, and said filter means is locked; said phase detector means output signal also being a relatively constant amplitude beat frequency signal having a frequency corresponding to the difference between the frequencies of said pair of input signals to said phase detector means when the loop is not locked; and wherein said sweep means is responsive to said beat frequency signal from said phase detector means for sweeping said VCO at a variable sweep rate.

2. Apparatus according to claim 1 wherein the sweep rate decreases as the frequency of the VCO output signal approaches the frequency of the input reference signal.

3. Apparatus according to claim 2 wherein said sweep means comprises:

first and second counter means;

comparator means responsive to each amplitude variation of the beat frequency signal from said phase detector means that exceeds a prescribed threshold value for incrementing said first counter means, every n incrementations of said first counter means causing the latter to increment said second counter means; and converter means operative for converting each unique count in said second counter means to a corresponding constant amplitude control voltage which is the output sweep voltage of said sweep means.

4. Apparatus according to claim 3 further comprising means for coupling the output sweep voltage from said converter means to the input terminal of said VCO for varying the frequency of the output signal thereof.

5. Apparatus according to claim 3 further comprising coupling means for coupling the output sweep voltage from said converter means to a third input terminal of said phase detector means, the output signal of said phase detector means comprising one of a phase error and a beat frequency signal voltage superimposed on a DC level that corresponds to said converter means stepped output sweep voltage.

6. Apparatus according to claim 5 wherein said low pass filter means blocks the beat frequency signal in the output signal of said phase detector means from said VCO and couples the stepped DC level and any error signal voltage in the output of said phase detector means to said VCO for controlling the operation thereof.

7. Apparatus according to claim 6 wherein said first counter means produces a single output pulse and is reset to a first prescribed reference count for every n incrementations thereof.

8. Apparatus according to claim 6 further comprising means for periodically resetting said first counter means.

9. Apparatus according to claim 6 further comprising means for selectively controlling the size of steps in the output voltage of said converter means.

10. Apparatus according to claim 6 further comprising means for selectively resetting said second counter means which is automatically reset to a second prescribed count when the contents thereof reaches a third prescribed count which corresponds to one extreme of the sweep voltage for restarting the sweep voltage from the the other extreme value thereof.

11. Apparatus according to claim 6 wherein said low pass filter means comprises an integrator means for converting any step change in the value of the DC component in the output signal of said phase detector means to a ramp voltage which is applied to the said VCO for controlling the operating frequency thereof.

* * * * *